United States Patent
Yang et al.

(10) Patent No.: US 10,230,942 B2
(45) Date of Patent: Mar. 12, 2019

(54) PIXEL ARRAY, DISPLAY DEVICE AND DISPLAY METHOD

(71) Applicants: BOE Technology Group Co., Ltd., Beijing (CN); Beijing BOE Optoelectronics Technology Co., Ltd., Beijing (CN)

(72) Inventors: Ming Yang, Beijing (CN); Xue Dong, Beijing (CN); Wenqing Zhao, Beijing (CN); Xiaochuan Chen, Beijing (CN); Pengcheng Lu, Beijing (CN); Renwei Guo, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 173 days.

(21) Appl. No.: 14/915,008

(22) PCT Filed: Sep. 30, 2015

(86) PCT No.: PCT/CN2015/091167
§ 371 (c)(1),
(2) Date: Feb. 26, 2016

(87) PCT Pub. No.: WO2016/123998
PCT Pub. Date: Aug. 11, 2016

(65) Prior Publication Data
US 2016/0360191 A1 Dec. 8, 2016

(30) Foreign Application Priority Data
Feb. 6, 2015 (CN) .......................... 2015 1 0065382

(51) Int. Cl.
*H04N 13/31* (2018.01)
*H04N 13/324* (2018.01)
*H04N 13/383* (2018.01)
*H04N 13/398* (2018.01)
*G02B 27/22* (2018.01)
*H01L 27/12* (2006.01)
(Continued)

(52) U.S. Cl.
CPC ......... *H04N 13/31* (2018.05); *G02B 27/2214* (2013.01); *H01L 27/124* (2013.01);
(Continued)

(58) Field of Classification Search
CPC ........... G02B 27/2214; H04N 13/0409; H04N 13/0422; H04N 13/0484; H04N 13/0497;
(Continued)

(56) References Cited

U.S. PATENT DOCUMENTS 6,831,662 B1 * 12/2004 Lum .................... G09G 3/3622
345/100
9,318,040 B1 * 4/2016 Tsai .................. G02F 1/136286
(Continued)

FOREIGN PATENT DOCUMENTS

CN 101339315 A 1/2009
CN 101859028 A 10/2010
(Continued)

OTHER PUBLICATIONS

Jan. 4, 2016—(WO) ISR & WO—App. No. PCT/CN2015/091167.
(Continued)

*Primary Examiner* — Loi H Tran
(74) *Attorney, Agent, or Firm* — Banner & Witcoff, Ltd.

(57) ABSTRACT

A pixel array, a display device and a display method are provided. The pixel array comprises: a plurality of sub-pixels arranged along a row direction and a column direction, the plurality of sub-pixels being defined by a plurality of data lines and a plurality of gate lines intersecting with each other, the data lines extending along the row direction, and the gate lines extending along the column direction, wherein, each row of sub-pixels include a plurality of repeating units arranged sequentially, the repeating unit including sub-pixels of three different colors; for each column of the sub-pixels, any two adjacent sub-pixels are of
(Continued)

different colors; and each of the sub-pixels has a length L along the row direction and a height H along the column direction, the length being less than or equal to the height, and in any two adjacent sub-pixels in each column of the sub-pixels, a lower row sub-pixel shifts by a distance D with respect to a previous row sub-pixel along the row direction, where $-L<D<0$ or $0<D<L$.

15 Claims, 7 Drawing Sheets

(51) Int. Cl.
  *H04N 13/305* (2018.01)
  *H04N 13/376* (2018.01)
  *H04N 13/371* (2018.01)
(52) U.S. Cl.
  CPC ......... *H04N 13/305* (2018.05); *H04N 13/324* (2018.05); *H04N 13/371* (2018.05); *H04N 13/376* (2018.05); *H04N 13/383* (2018.05); *H04N 13/398* (2018.05)
(58) Field of Classification Search
  CPC ........... H04N 13/0404; H04N 13/0472; H04N 13/0477; H01L 27/124
  USPC .......................................................... 348/54
  See application file for complete search history.

(56) References Cited

U.S. PATENT DOCUMENTS

| | | | | |
|---|---|---|---|---|
| 2010/0265284 | A1* | 10/2010 | Satou | G09G 3/003 345/697 |
| 2011/0007390 | A1* | 1/2011 | Yanamoto | G02B 27/2214 359/466 |
| 2013/0021334 | A1 | 1/2013 | Lee et al. | |
| 2013/0208020 | A1* | 8/2013 | Jung | G09G 3/003 345/690 |
| 2014/0347362 | A1* | 11/2014 | Maleki | H04N 13/0029 345/427 |
| 2015/0339969 | A1* | 11/2015 | Gu | G09G 5/02 345/77 |
| 2016/0035265 | A1* | 2/2016 | Park | G09G 3/2003 345/694 |
| 2016/0105667 | A1* | 4/2016 | Yang | H04N 13/0468 348/55 |
| 2017/0084249 | A1* | 3/2017 | Kim | G09G 3/3688 |

FOREIGN PATENT DOCUMENTS

| | | |
|---|---|---|
| CN | 102469331 A | 5/2012 |
| CN | 102628999 A | 8/2012 |
| CN | 102681185 A | 9/2012 |
| CN | 102681244 A | 9/2012 |
| CN | 103278954 A | 9/2013 |
| CN | 103621077 A | 3/2014 |
| CN | 103681244 A | 3/2014 |
| CN | 103945203 A | 7/2014 |
| CN | 104597609 A | 5/2015 |

OTHER PUBLICATIONS

Jul. 12, 2016—(CN)—First Office Action Appn 201510065382.0 with English Tran.
Mar. 14, 2017—(CN) Second Office Action Appn 201510065382.0 with English Tran.

* cited by examiner

US 10,230,942 B2

PIXEL ARRAY, DISPLAY DEVICE AND DISPLAY METHOD

The application is a U.S. National Phase Entry of International Application No. PCT/CN2015/091167 filed on Sep. 30, 2015, designating the United States of America and claiming priority to Chinese Patent Application No. 201510065382.0 filed on Feb. 6, 2015. The present application claims priority to and the benefit of the above-identified applications and the above-identified applications are incorporated by reference herein in their entirety.

TECHNICAL FIELD

Embodiments of the present disclosure relate to a pixel array, a display device, and a display method.

BACKGROUND

In recent years, a three-dimensional display technology attracts more and more attention, and a basic principle thereof is to make left and right eyes of a person respectively receive different images, and then image information is superimposed and regenerated by a brain, so as to achieve a three-dimensional effect.

The three-dimensional display technology is mainly divided into two implementation modes: a naked-eye type and a glass type, wherein, the glass-type three-dimensional display technology needs special glasses to be worn, which is inconvenient to carry, while the naked-eye type has no special requirements, so the naked-eye type three-dimensional display technology is more advantageous. A current implementation mode of a naked-eye type three-dimensional display is to mainly arrange a light-splitting device in front of a display panel, so as to make light for displaying a left-eye image and light for displaying a right-eye image enter a left eye and a right eye of a viewer, respectively; for example, the light-splitting device mainly includes a parallax barrier and a lenticular lens.

With rapid development of the three-dimensional display technology, such a technology has also been rapidly applied in mobile handheld products. For a conventional virtual pixel, as shown in FIG. 1, each sub-pixel is defined by a gate line 11 extending along a horizontal direction and a data line 12 extending along a vertical direction, which intersect with each other; and a horizontal length a and a vertical length b of each sub-pixel meet a relational expression: a<b and a≠b/3; in this way, since the horizontal length of the sub-pixel level is less than the vertical length thereof, when a mobile handheld product is in a landscape mode for viewing 3D display, a pitch between adjacent sub-pixels is relatively large, an image resolution, especially an image resolution in a horizontal direction, is significantly decreased. Moreover, due to a too small continuous viewing angle, it is prone to have defects such as a crosstalk.

SUMMARY

Embodiments of the present disclosure provide a pixel array, a display device and a display method, which can alleviate image crosstalk in a 3D display mode, increase an image resolution in a horizontal direction, and increase a visible viewing angle and a visual scope of a 3D image.

In one aspect, an embodiment of the present disclosure provides a pixel array, comprising a plurality of sub-pixels arranged along a row direction and a column direction, the plurality of sub-pixels being defined by a plurality of data lines and a plurality of gate lines intersecting with each other, the data lines extending along the row direction, and the gate lines extending along the column direction, wherein, each row of sub-pixels include a plurality of repeating units arranged sequentially, the repeating unit including sub-pixels of three different colors; for each column of the sub-pixels, any two adjacent sub-pixels are of different colors; each of the sub-pixels has a length L along the row direction and a height H along the column direction, the length being less than or equal to the height, and in any two adjacent sub-pixels in each column of the sub-pixels, a lower sub-pixel shifts by a distance D with respect to an upper sub-pixel along the row direction, where −L<D<0 or 0<D<L.

In another aspect, an embodiment of the present disclosure provides a display device, comprising: a display panel, including the pixel array described above, and including an array substrate and an opposed substrate opposite to each other, the plurality of gate lines and the plurality of data lines being formed on the array substrate.

In still another aspect, an embodiment of the present disclosure provides a display method for a display device; the display device comprises: a display panel, including the pixel array according to claim 1, and including an array substrate and an opposed substrate opposite to each other, the plurality of gate lines and the plurality of data lines being formed on the array substrate; a light-splitting device, configured to project light for displaying a left-eye image and light for displaying a right-eye image to a left eye and a right eye of a viewer, respectively; and the display method comprising: step 1: setting the display device to be in a 3D display mode, and receiving and displaying data of the left-eye image and data of the right-eye image in a frame of image; step 2: for each row of the sub-pixels, defining N sub-pixels as buffer pixels displaying a black color every M sub-pixels of the three different colors, where M and N are nonzero natural numbers; step 3: alternately inputting the data of the left-eye image and the data of the right-eye image into a set of the M sub-pixels and the N buffer pixels to be alternately used as a visible region of the left eye and a visible region of the right eye.

In yet another aspect, an embodiment of the present disclosure provides a pixel array, comprising a plurality of sub-pixels arranged along a row direction and a column direction, the plurality of sub-pixels being defined by a plurality of data lines and a plurality of gate lines intersecting with each other, the gate lines extending along the row direction, and the data lines extending along the column direction, wherein, each column of sub-pixels include a plurality of repeating units arranged sequentially, the repeating unit including sub-pixels of three different colors; for each row of the sub-pixels, any two adjacent sub-pixels are of different colors; each of the sub-pixels has a length L1 along the row direction and a height H1 along the column direction, the length being greater than or equal to the height, and in any two adjacent sub-pixels in each row of the sub-pixels, a right sub-pixel shifts by a distance D with respect to a left sub-pixel along the column direction, where −H1<D<0 and 0<D<H1.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
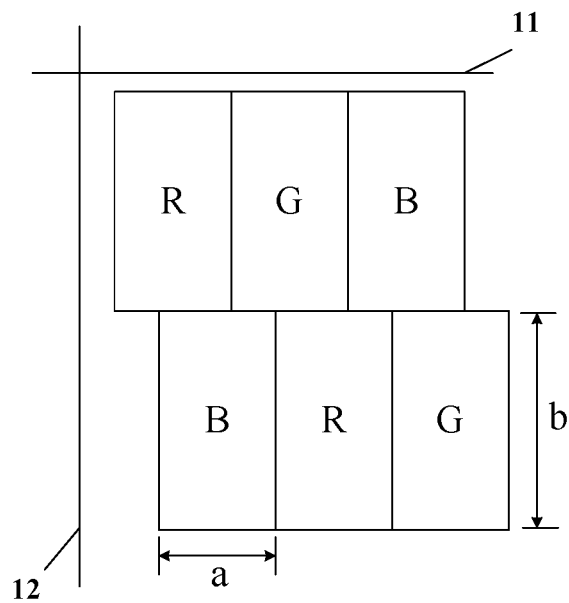
FIG. 1 is an arrangement diagram of a conventional virtual pixel.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Likewise, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position is a described object is changed, the relative positional relationship may also be correspondingly changed.

Embodiments of the present disclosure provide a pixel array, a display device comprising the pixel array and a display method for the display device.

The pixel array according to an embodiment of the present disclosure comprises: a plurality of sub-pixels arranged along a row direction and a column direction, the plurality of sub-pixels being defined by a plurality of data lines and a plurality of gate lines intersecting with each other, the data lines extending along the row direction, and the gate lines extending along the column direction, wherein, each row of sub-pixels include a plurality of repeating units arranged sequentially, the repeating unit including sub-pixels of three different colors; for each column of the sub-pixels, any two adjacent sub-pixels are of different colors; and each of the sub-pixels has a length L along the row direction and a height H along the column direction, the length L being less than or equal to the height H, and in any two adjacent sub-pixels in each column of the sub-pixels, a lower row of sub-pixels shift by a distance D with respect to an upper row of sub-pixels along the row direction, where $-L<D<0$ or $0<D<L$. The pixel array according to an embodiment of the present disclosure, for example, is an arrangement of pixels in a landscape mode of a handheld mobile product; using the above pixel array, when a display device comprising the pixel array is used for viewing an image, and particularly, when a 3D display device of light-splitting type comprising the pixel array is used for viewing a 3D image, since a length of each sub-pixel along a direction of data lines is less than or equal to a height along a direction of gate lines, in this way, as compared with a conventional pixel, a number of sub-pixels arranged in a row direction in the pixel array according to the embodiment of the present disclosure is increased, so that a resolution in a horizontal direction can be increased, content displayed in a lateral image is increased, and image quality is further improved.

Further, in order to further alleviate a crosstalk between a left-eye image and a right-eye image in a 3D display mode, the pixel array according to an embodiment of the present disclosure further comprises a buffer pixel only displaying a black color in the 3D display mode, so that a continuous viewing distance of a display device comprising the pixel array is increased, and the crosstalk is reduced.

Hereinafter, in order to make technical solutions of the embodiments of the present disclosure more apparent, the pixel array, the display device comprising the pixel array and the display method for the display device provided by the embodiments of the present disclosure will be described in detail in connection with the drawings.

A First Embodiment

Figure 2:
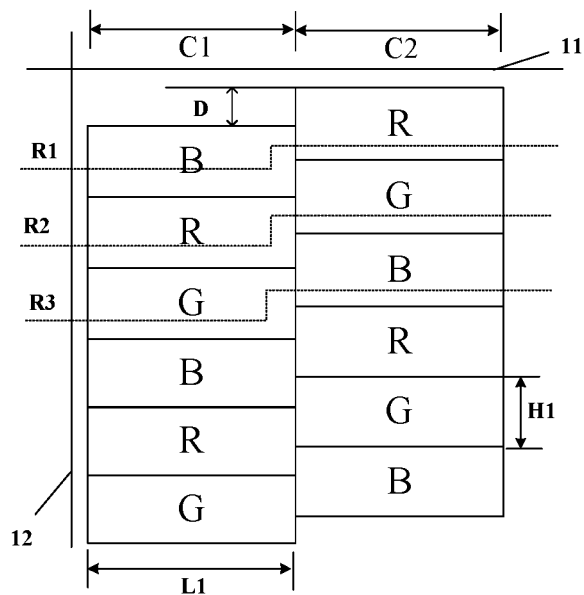
FIG. 2 is an arrangement schematic diagram of a pixel array according to a first embodiment.

FIG. 2 shows an arrangement schematic diagram of a pixel array according to the first embodiment; the pixel array may use a virtual pixel driving manner of sub-pixel multiplexing, so that the display resolution is improved without increasing physical resolution.

As shown in FIG. 2, a gate line 11 extends along a row direction, that is, a horizontal direction in the diagram; a data line 12 extends along a column direction, that is, a vertical direction in the diagram; and each sub-pixel, for example, a red sub-pixel (R), a green sub-pixel (G) or a blue sub-pixel (B), is defined by the gate line 11 and the data line 12 intersecting with each other. Each column of sub-pixels, for example, a sub-pixel column C1 or C2, includes a plurality of repeating units arranged sequentially, and the repeating unit includes sub-pixels of three different colors; for each row of sub-pixels, for example, R1, R2 or R3, any two adjacent sub-pixels are of different colors, wherein a length L1 of each sub-pixel along the row direction is greater than or equal to a height H1 along the column direction, for example, L1=H1, L1=(3/2)H1, L1=2H1 and so on; and moreover, for each row of the sub-pixels, for example, a sub-pixel row R1, a right column sub-pixel in any two adjacent sub-pixels, for example, a sub-pixel R in a column C2, with respect to a left column sub-pixel, for example, a sub-pixel B in a column C1, shifts by a distance D along the column direction, where −H1<D<0 or 0<D<H1.

Here, in an embodiment of the present disclosure, for shifting between pixels, a distance D shifting downwards along the column direction, that is, shifting along a direction of increasing a row number, may be defined as a positive value, and accordingly, a distance D shifting upwards along the column direction, that is, shifting along a direction of decreasing a row number, may be defined as a negative value; on the contrary, the distance D shifting downwards along the column direction, that is, shifting along the direction of increasing the row number, may be defined as a negative value, and accordingly, the distance D shifting upwards along the column direction, that is, shifting along the direction of decreasing the row number, may be defined as a positive value, which are not limited by the embodiment of the present disclosure, but for convenience of description, here, it is described by taking an example that the distance D shifting downwards along the column direction is defined as a positive value, and the distance D shifting towards an opposite direction is defined as a negative value.

Exemplarily, in the pixel array according to the first embodiment, for each row of the sub-pixels, for example, a sub-pixel row R1, a right column sub-pixel in any two adjacent sub-pixels, for example, a sub-pixel R in a column C2, with respect to a left column sub-pixel, for example, a sub-pixel B in a column C1, shifts by a distance D along the column direction, and the distance D may be a constant positive value, where 0<D<H1; or, the distance D may be a constant negative value, where −H1<D<0. For example, the pixel array may be in a step shape which gradually descends from left to right, or a step shape which gradually rises from left to right.

Figure 3:
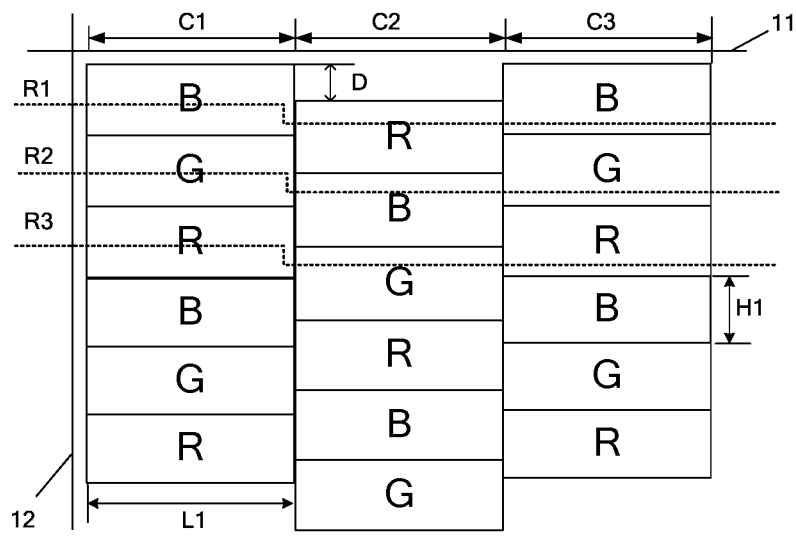
FIG. 3(a) and FIG. 3(b) are exemplary arrangement schematic diagrams of the pixel array according to the first embodiment.
Figure 3:
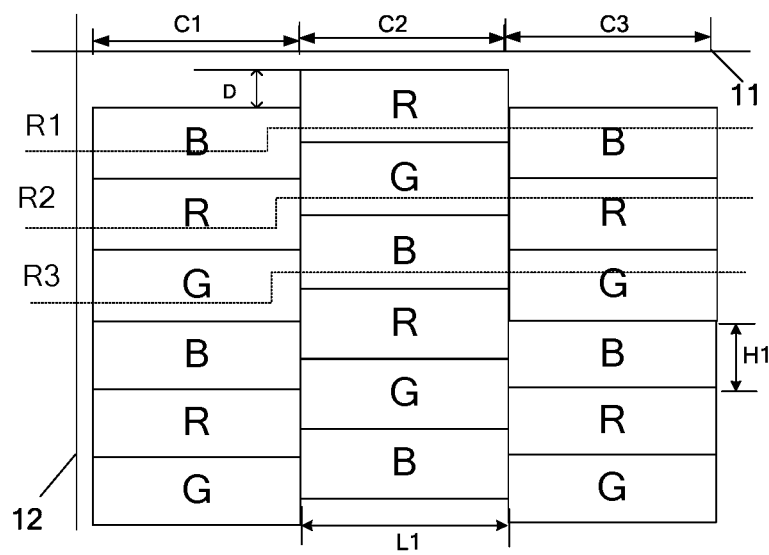

Exemplarily, for each row of the sub-pixels, for example, a sub-pixel row R1, a sub-pixel in an even-numbered column in any two adjacent sub-pixels, for example, a sub-pixel R in a column C2, with respect to a previous column sub-pixel adjacent thereto, for example, a sub-pixel B in a column C1, may shift by a distance D downwards along the column direction, and 0<D<H1; and when a sub-pixel on a right side in any two adjacent sub-pixels is a sub-pixel in an odd-numbered column, for example, a sub-pixel B in a column C3, with respect to a previous column sub-pixel adjacent thereto, for example, a sub-pixel R in a column C2, may shift by a distance D upwards along the column direction, and −H1<D<0. In this way, the pixel array may form a snake-like arrangement shown in FIG. 3(a). Alternatively, a sub-pixel in an even-numbered column in any two adjacent sub-pixels, for example, a sub-pixel R in a column C2, with respect to a previous column sub-pixel adjacent thereto, for example, a sub-pixel B in a column C1, may shift upwards along the column direction by a distance D, and −H1<D<0; and when a sub-pixel on a right side of any two adjacent sub-pixels is a sub-pixel in an odd-numbered column, for example, a sub-pixel B in a column C3, with respect to a previous column sub-pixel adjacent thereto, for example, a sub-pixel R in a column C2, may shift downwards along the column direction by a distance D, and 0<D<H1. In this way, the pixel array may form a snake-like arrangement shown in FIG. 3(b).

For the pixel array according to the first embodiment, since a length of each sub-pixel along a horizontal direction is greater than or equal to a length along a vertical direction, as compared with a conventional virtual pixel shown in FIG. 1, a number of channels for the data lines may be reduced.

Hereinafter, it is described in conjunction with a specific example, it is assumed that, a display panel comprising the pixel array has a resolution of m*n, for the pixel array according to the first embodiment of the present disclosure, if L1=H1, a number of channels for the data lines is m and a number of channels for the gate lines is n; if L1=(3/2)H1, the number of channels for the data lines is m and the number of channels for the gate lines is $$\frac{3n}{2};$$

if L1=2H1, the number of channels for the data lines is m and the number of channels for the gate lines is 2n; and for the conventional virtual pixel shown in FIG. 1, for example, a horizontal length a and a vertical length b of each sub-pixel meet a relational expression: a=b/2 or a=2b/3; if a=b/2, the number of channels for the data lines is 2m and the number of channels for the gate lines is n; if a=2b/3, the number of channels for the data lines is 3m/2 and the number of channels for the gate lines is n; it can be found from the above comparison that, as compared with a conventional virtual pixel array, in the pixel array according to an embodiment, the number of channels for the data lines is significantly reduced; and as compared with the gate lines, control of the data lines is more complex, so that the pixel array of the embodiment may significantly reduce product cost.

Figure 4:
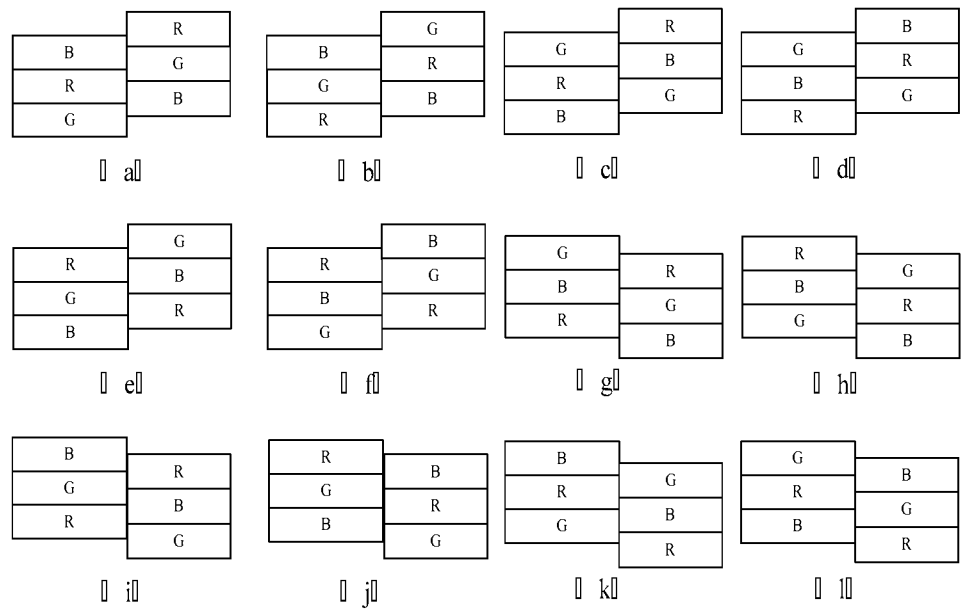
FIG. 4 shows an exemplary arrangement diagram of the pixel array according to the first embodiment.

For example, FIG. 4(a) to FIG. 4(l) show exemplary arrangement diagrams of the pixel array of the embodiment. As shown in FIG. 4(a), a first column of sub-pixels is BRG, and a second column of sub-pixels is RGB; as shown in FIG. 4(b), a first column of sub-pixels is BGR, and a second column of sub-pixels is GRB; as shown in FIG. 4(c), a first column of sub-pixels is GRB, and a second column of sub-pixels is RBG; as shown in FIG. 4(d), a first column of sub-pixels is GBR, and a second column of sub-pixels is BRG; as shown in FIG. 4(e), a first column of sub-pixels is RGB, and a second column of sub-pixels is GBR; as shown in FIG. 4(f), a first column of sub-pixels is RBG, and a second column of sub-pixels is BGR; in FIG. 4(a) to FIG. 4(f), the second column of sub-pixels shift upwards with respect to the first column of sub-pixels, for example, 1/2H1; as shown in FIG. 4(g), a first column of sub-pixels is GBR, and a second column of sub-pixels is RGB; as shown in FIG. 4(h), a first column of sub-pixels is RBG, and a second column of sub-pixels is GRB; as shown in FIG. 4(i), a first column of sub-pixels is BGR, and a second column of sub-pixels is RBG; as shown in FIG. 4(j), a first column of sub-pixels is RGB, and a second column of sub-pixels is BRG; as shown in FIG. 4(k), a first column of sub-pixels is BRG, and a second column of sub-pixels is GBR; as shown in FIG. 4(l), a first column of sub-pixels is GRB, and a second column of sub-pixels is BGR; and in FIG. 4(g) to FIG. 4(l), the second column of sub-pixels shift downwards with respect to the first column of sub-pixels, for example, ½H1. It is merely exemplarily listed 12 types of pixel arrangement diagrams in the above, but is not limitative to the embodiment of the present disclosure, and other manners may be also used for arranging an pixel array in practice.

It should be noted that, for convenience of description, in the drawings and the specification, it is described by taking an example that each repeating unit includes a red sub-pixel (R), a green sub-pixel (G) and a blue sub-pixel (B), however, in practice, those skilled in the art may select a repeating unit including sub-pixels of other colors, which is not limited by the embodiment of the present disclosure.

The Second Embodiment

Figure 5:
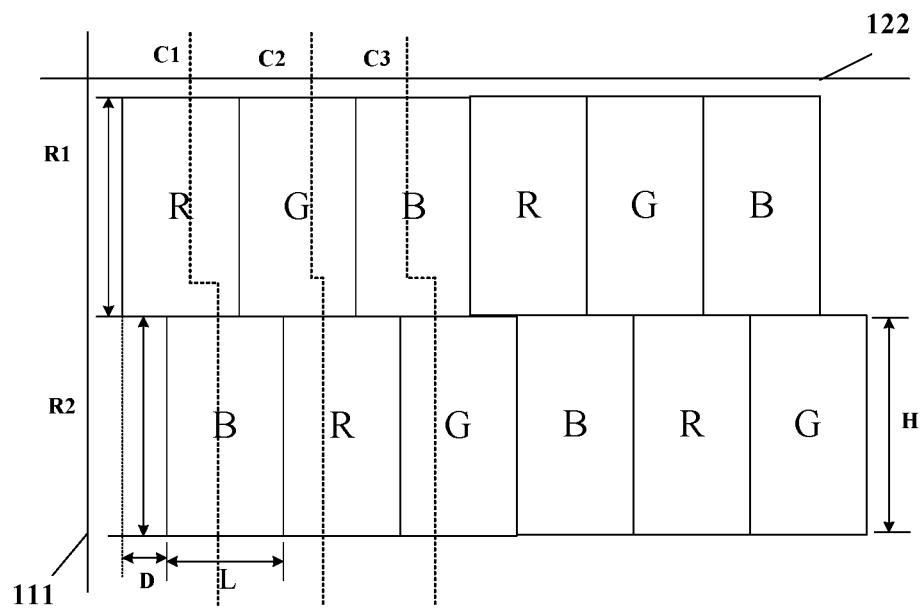
FIG. 5 shows an arrangement schematic diagram of a pixel array according to a second embodiment.

FIG. 5 shows a pixel array according to the present embodiment, and the pixel array belongs to a virtual pixel. As shown in FIG. 5, a gate line 111 extends along a column direction, that is, a vertical direction; a data line 122 extends along a column direction, that is, a horizontal direction; each sub-pixel, for example, a red sub-pixel (R), a green sub-pixel (G) or a blue sub-pixel (B), is defined by the gate line 111 and the data line 122 intersecting with each other; each row of sub-pixels, for example, a first row of sub-pixels R1, include a plurality of repeating units arranged sequentially, and the repeating unit includes sub-pixels of three different colors; and for each column of sub-pixels, for example, a first column of sub-pixels C1, any two adjacent sub-pixels are of different colors, wherein a length L of each sub-pixel along the row direction is less than or equal to a height H along the column direction, and moreover, for each column of sub-pixels, for example, a first column of sub-pixels C1, a lower row of sub-pixels in any two adjacent sub-pixels, for example, a sub-pixel B in a row R2, with respect to an upper row of sub-pixels, for example, a sub-pixel R in a row R1, shift by a distance D along the row direction, where $-L<D<0$ or $0<D<L$.

Here, in the embodiment of the present disclosure, for shifting between pixels, a distance D shifting rightwards along the row direction, that is, shifting along a direction of increasing a number of columns, may be defined as a positive value, and accordingly, a distance D shifting leftwards along the row direction, that is, shifting along a direction of decreasing a number of columns, may be defined as a negative value; on the contrary, the distance D shifting leftwards along the row direction, that is, shifting along the direction of decreasing a number of columns, may be defined as a negative value, and accordingly, the distance D shifting rightwards along the row direction, that is, shifting along the direction of increasing a number of columns, may be defined as a positive value, which are not limited by the embodiment of the present disclosure, but for convenience of description, here, it is described by taking an example that the distance D shifting rightwards along the row direction is defined as a positive value, and the distance D shifting towards a reverse direction is defined as a negative value.

Figure 6:
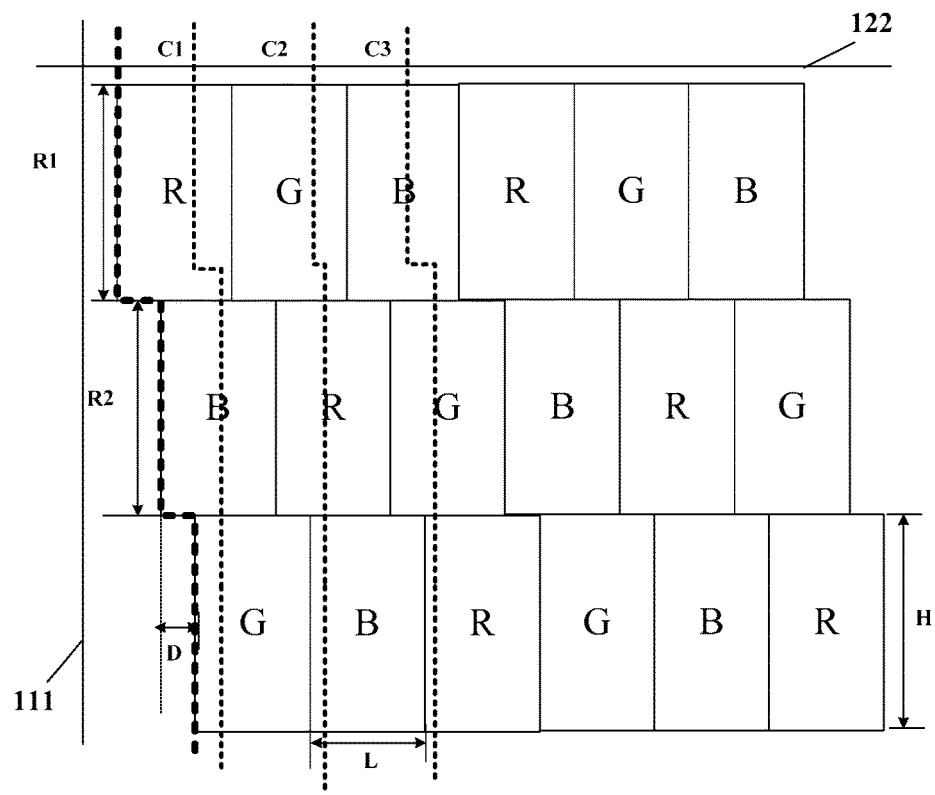
FIG. 6 shows an arrangement schematic diagram of another pixel array according to the second embodiment.

Exemplarily, in the pixel array according to the second embodiment, for each column of the sub-pixels, for example, a first column of sub-pixels C1, a lower row of sub-pixels in any two adjacent sub-pixels, for example, a sub-pixel B in a row R2, with respect to an upper column of sub-pixels, for example, a sub-pixel R in a row R1, shift by a distance D along the row direction, and the distance D may be a positive value, where $0<D<L$. At this time, the absolute value of the shifting distance D may be constant or changed, which is not limited by the embodiment of the present disclosure. FIG. 6 shows a case where the absolute value of the shifting distance D is constant, and as shown in FIG. 6, the pixel array may be formed in a step shape at this moment.

Figure 7:
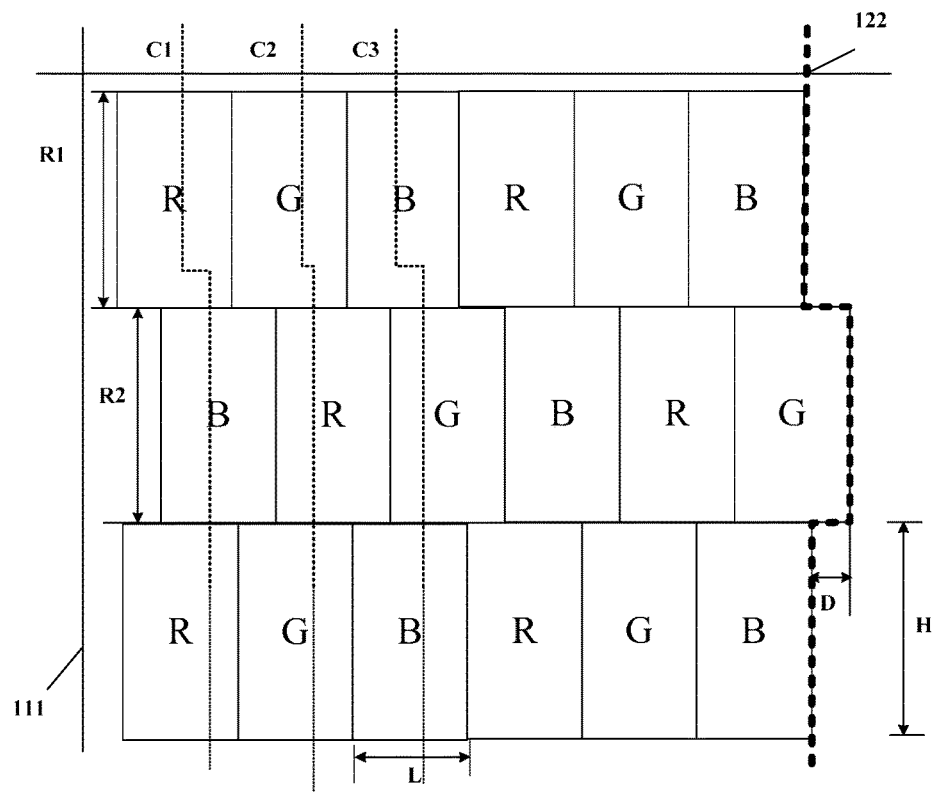
FIG. 7 shows an arrangement schematic diagram of still another pixel array according to the second embodiment.

Exemplarily, in the pixel array according to the second embodiment, for each column of the sub-pixels, there is no relative shifting between sub-pixels in an odd-numbered row, there is no relative shifting between sub-pixels in an even-numbered row, and in any two adjacent sub-pixels, the sub-pixel in an even-numbered row, for example, a sub-pixel B in a row R2, with respect to a previous row of sub-pixels adjacent thereto, for example, a sub-pixel R in a row R1, shift by a distance D rightwards along the row direction, and $0<D<L$; and for each column of the sub-pixels, the sub-pixel in an even-numbered row in any two adjacent sub-pixels, for example, a sub-pixel B in a row R2, with respect to a next row sub-pixel adjacent thereto, for example, a sub-pixel R in a row R3, shifts by a distance D leftwards along the row direction, and $-L<D<0$. Moreover, for each column of the sub-pixels, sub-pixels in an odd-numbered row are of a same color, and sub-pixels in an even-numbered row are of a same color. At this moment, the shifting distance D may be constant or changed, which is not limited by the embodiment of the present disclosure FIG. 7 shows a case where the absolute value of the shifting distance D is constant, and as shown in FIG. 7, the pixel array may be formed in a snake shape at this moment.

Exemplarily, the length L and the height H of each sub-pixel may meet relationships of: $L=H$; $L=(\frac{2}{3})\cdot H$; or $L=(\frac{1}{2})\cdot H$.

Exemplarily, each repeating unit along a row direction may include a red sub-pixel (R), a green sub-pixel (G) and a blue sub-pixel (B).

In the pixel array according to the present disclosure, because the data lines extend along the row direction, and the gate lines extend along the column direction, and a height of each sub-pixel along the column direction is greater than or equal to a length along the row direction, a number of the data lines along the column direction may be reduced, and thus product cost may be significantly reduced. Moreover, when the pixel array is applied in 3D display, since more sub-pixels may be arranged in the row direction, a horizontal resolution in the row direction may be improved, content displayed in the image may be increased, and image quality may be further improved.

Exemplarily, when the pixel array according to the embodiment of the present disclosure is applied in a display device which can switch between a 2D mode and a 3D mode, when the display device is in the 3D display mode, in order to avoid crosstalk between a left-eye image and a right-eye image, the pixel array of the embodiment may further comprise buffer pixels displaying a black color, and for each row of the sub-pixels, N sub-pixels are defined as the buffer pixels every M sub-pixels, where M and N may be natural numbers greater than or equal to 1, for example, M and N may be 1, 2, 3, 4 and so on. In this way, for a 3D display device of a light-splitting type, a set of the M sub-pixels plus the N buffer pixels is alternately used as a visible region of a left eye and a visible region of a right eye along the row direction.

Figure 8:
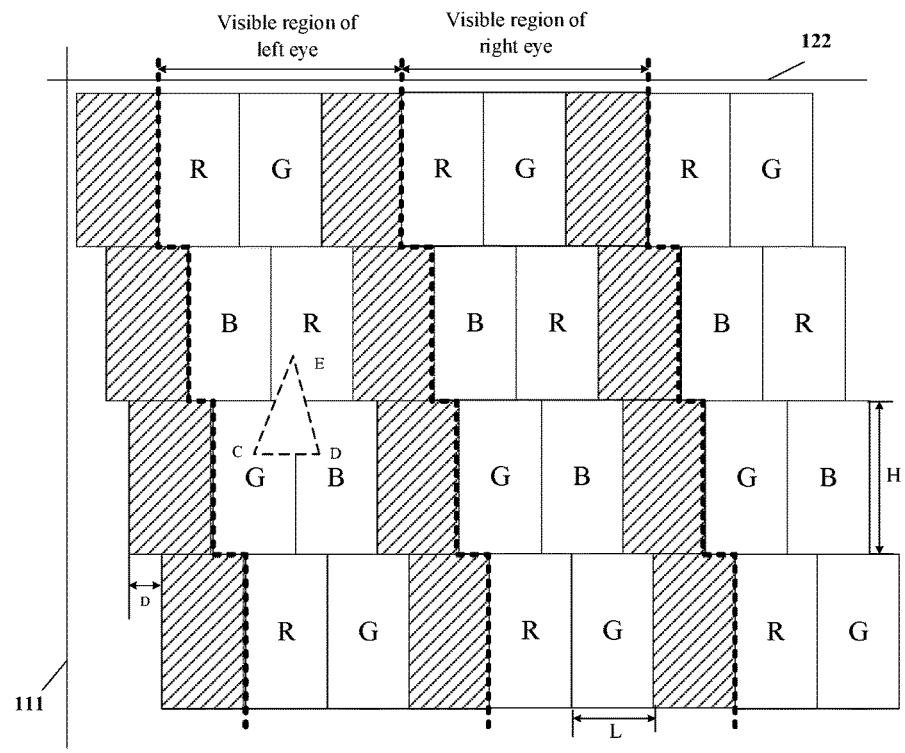
FIG. 8 shows an exemplary arrangement diagram of a pixel array comprising buffer pixels according to an embodiment of the present disclosure.

FIG. 8 shows an exemplary arrangement diagram of the pixel array of the embodiment in a 3D display mode, where M=2, N=1, that is, a left eye and a right eye of a viewer may see three columns of sub-pixels, respectively; it can be seen from FIG. 8 that, for one row of sub-pixels, 2 sub-pixels plus 1 buffer pixel are used as a visible region of the left eye, 2 adjacent sub-pixels plus 1 buffer pixel are used as a visible region of the right eye, and the visible region of the left eye and the visible region of the right eye are arranged alternately along the row direction.

Figure 9:
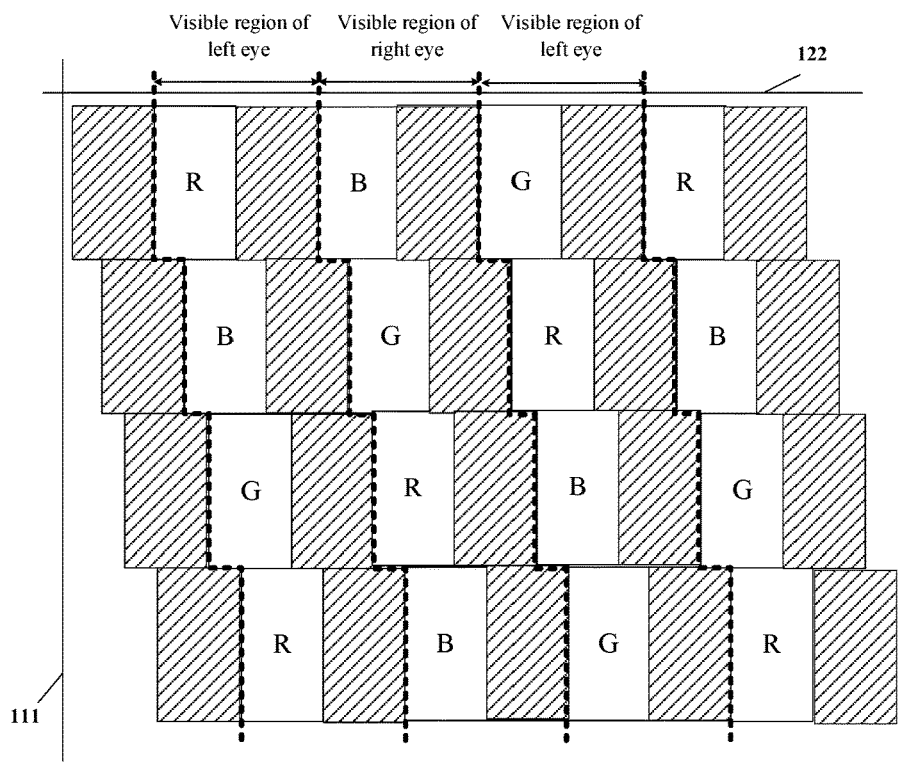
FIG. 9 shows another exemplary arrangement diagram of the pixel array comprising buffer pixels according to an embodiment of the present disclosure.

FIG. 9 shows another exemplary arrangement diagram of the pixel array of the embodiment in a 3D display mode, where M=1, N=1, that is, a left eye and a right eye of a viewer may see two columns of sub-pixels, respectively; it can be seen from FIG. 9 that, for one row of sub-pixels, 1 sub-pixel plus 1 buffer pixel are used as a visible region of the left eye, 1 adjacent sub-pixel plus 1 buffer pixel are used as a visible region of the right eye, and the visible region of the left eye and the visible region of the right eye are arranged alternately along the row direction.

Figure 10:
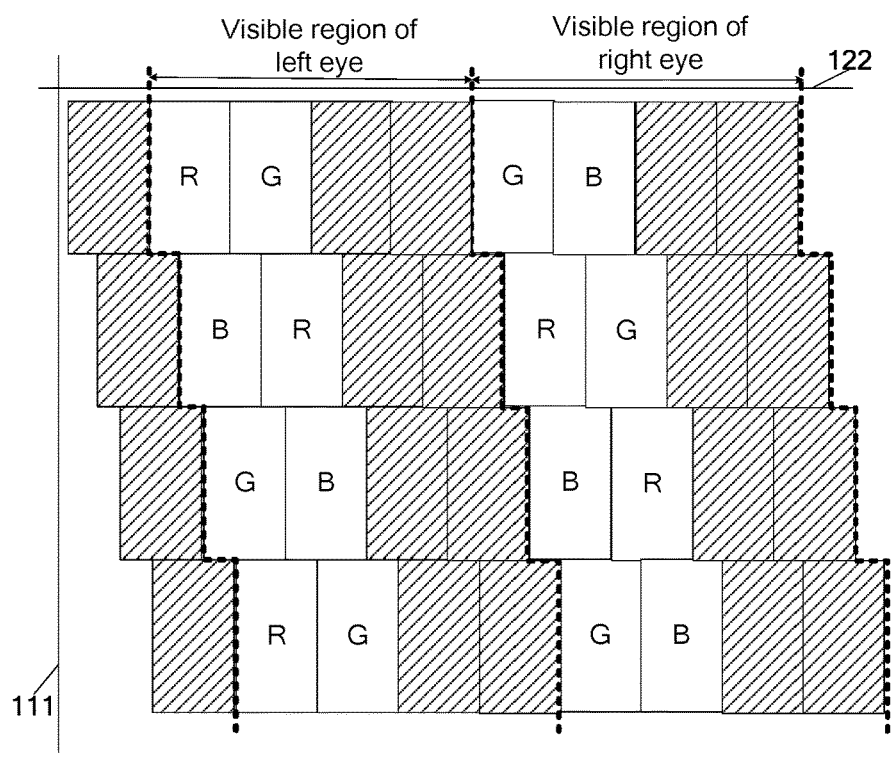
FIG. 10 shows still another exemplary arrangement diagram of the pixel array comprising buffer pixels according to an embodiment of the present disclosure.

FIG. 10 shows still another exemplary arrangement diagram of the pixel array of the embodiment in a 3D display mode, where M=2, N=2, that is, a left eye and a right eye of a viewer may see four columns of sub-pixels, respectively; it can be seen from FIG. 10 that, for one row of sub-pixels, 2 sub-pixels plus 2 buffer pixels are used as a visible region of the left eye, 2 adjacent sub-pixels plus 2 buffer pixels are used as a visible region of the right eye, and the visible region of the left eye and the visible region of the right eye are arranged alternately along the row direction.

Hereinabove, it is exemplarily shown arrangements of a pixel array having buffer pixels when M and N are nonzero natural numbers and the sub-pixels are arranged in a step shape; when M and N are other values, it is similar to the above, which will not be repeated here. In application, those skilled in the art may select suitable M and N according to actual needs, and different M and N may cause different display effect, which is not limited by the embodiment of the present disclosure.

Figure 11:
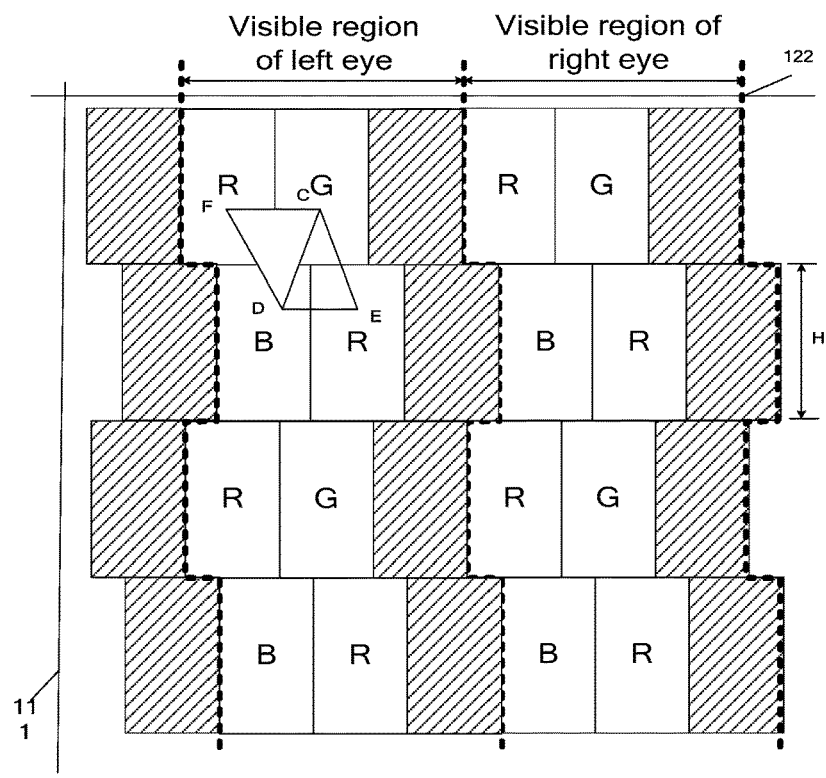
FIG. 11 shows yet another exemplary arrangement diagram of the pixel array comprising buffer pixels according to an embodiment of the present disclosure.

Exemplarily, FIG. 11 shows still another exemplary arrangement diagram of the pixel array according to the embodiment in a 3D display mode, wherein the arrangement of sub-pixels before adding the buffer pixels corresponds to the arrangement diagram shown in FIG. 7, where M=2, N=1, that is, a left eye and a right eye of a viewer may see three columns of sub-pixels, respectively; it can be seen from FIG. 11 that, for one row of sub-pixels, 2 sub-pixels plus 1 buffer pixel are used as a visible region of the left eye, 2 adjacent sub-pixels plus 1 buffer pixel are used as a visible region of the right eye, and the visible region of the left eye and the visible region of the right eye are arranged alternately along the row direction. Similar to the step shape arrangement of sub-pixels, in a case where the sub-pixels are arranged in a snake shape, M and N may be other nonzero natural numbers, which is no longer listed one by one here.

Further, for the pixel array comprising the buffer pixels according to the present embodiment, in a 3D display mode, a visible region of a left eye and a visible region of a right eye are added with the buffer pixels displaying a black color, so that a left-eye image and a right-eye image may be separated from each other, it is possible to improve crosstalk between the left-eye image and the right-eye image, and increase a continuous viewing distance of a 3D image.

Hereinafter, it is described how to improve crosstalk by the buffer pixels in conjunction with the drawings in detail.

Figure 12:
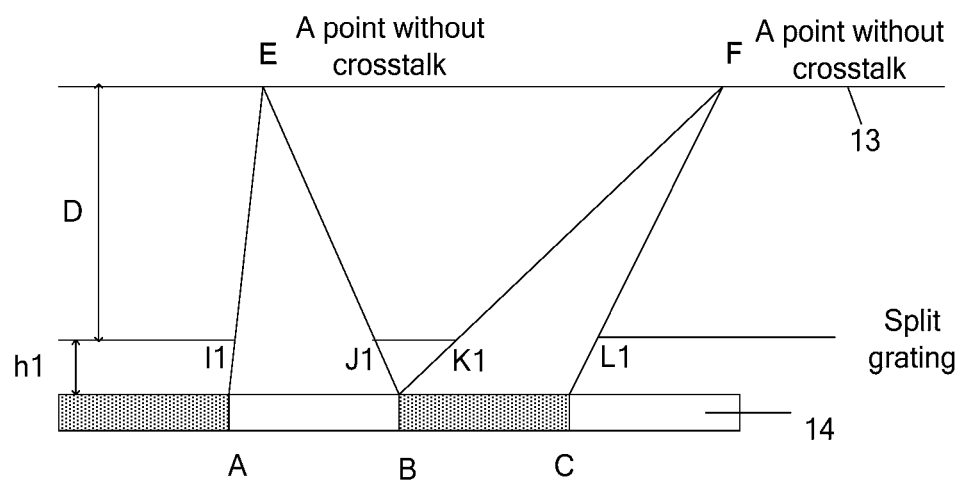
FIG. 12 shows a 3D display optical path diagram of a common pixel array without buffer pixels.

FIG. 12 shows a 3D optical path diagram of a common pixel array without buffer pixels, wherein, 14 is a display panel, and a slit grating is arranged on a light exiting side of the display panel, 13 denotes a viewing plane; in the display panel 14, a portion AB represents a left-eye image and a portion BC represents a right-eye image, the portion AB of the left-eye image may be viewed through a light-transmitting part I1J1 of the slit grating at a viewing point E, and at this moment, the right-eye image cannot be viewed at a viewing point E; when the viewing point moves to other points except the point E, besides the left-eye image, the right-eye image may be also viewed through the light-transmitting part I1J1 of the slit grating, resulting in crosstalk. Accordingly, inventors have found that: for such a pixel array, corresponding to the light-transmitting part I1J1, when the viewer is located at other points except the point E, a probability of occurrence of crosstalk is very high, so that this type of pixel array has small continuous viewing angle upon viewing a 3D image.

Figure 13:
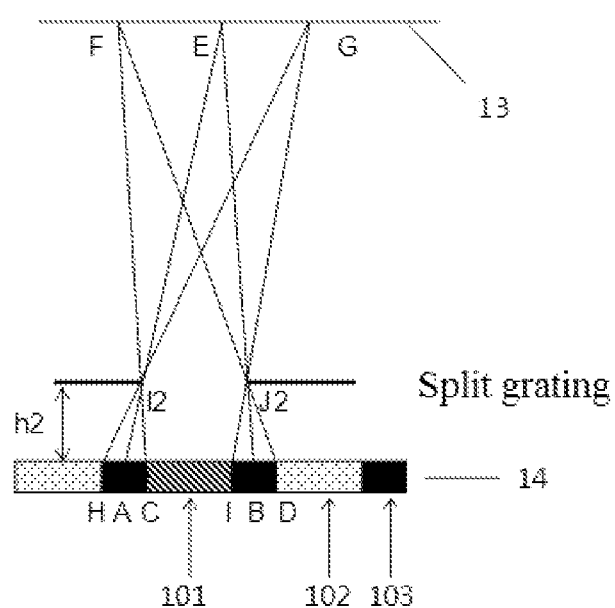
FIG. 13 shows a 3D display optical path diagram of a pixel array with buffer pixels according to an embodiment of the present disclosure.

FIG. 13 shows a 3D optical path diagram of a pixel array with buffer pixels according to the present embodiment, wherein, 14 is a display panel, and a slit grating is arranged on a light exiting side of the display panel, 13 denotes a viewing plane, 101 is a left-eye image and 102 is a right-eye image, portions AB, CD and HI are the visible regions of the left-eye, and black portions HC, ID and 103 are buffer pixels displaying a black color; and the corresponding sub-pixels display the black color through a driving circuit when performing 3D display. At a viewing point E, AB may be seen through a light-transmitting part I2J2 of a 3D grating; when the viewing point moves to a point F, CD may be seen through the light-transmitting part I2J2 of the 3D grating, and at this moment, the left-eye image may be still seen; when the viewing point continuously moves left, a right-eye image may be seen through the light-transmitting part I2J2 of the 3D grating, resulting in crosstalk; it can be found that, the point F is a left critical point of crosstalk; similarly, there is a right critical point G for crosstalk, a portion FG is a continuous viewing distance, and angles FI2G, FJ2G are continuous viewing angles. It can be found that: by adding buffer pixels, the continuous viewing distance and continuous viewing angle may be increased. Through the optical path diagram, a formula for calculating a pitch of the 3D grating may be acquired: Ws=KQB(M+N)/(Q+(M+N)B), where K is a number of viewpoints of the display device in a 3D display mode, Q is a distance between a left eye and a right eye of the viewer, and B is a length of each of the sub-pixels along the row direction, N is a number of the buffer pixels, M is a number of sub-pixels normally displaying an image on the left or right sides of the N buffer pixels, and here, M and N are natural numbers greater than or equal to 1.

Further, for a pixel array with buffer pixels according to the present embodiment, since a part of sub-pixels are used as buffer pixels displaying a black color, a number of sub-pixels seen by a single eye is relatively reduced, and therefore, in order to compensate for such loss of resolution, a rendering algorithm may be used for compensation. Here, it is described with reference to FIG. 8 that, shaded portions are buffer pixels, and it can be found from the diagram that: there are two different images on both sides of the buffer pixels, and a number of the buffer pixels in the pixel array is ⅓ of the number of sub-pixels in the visible region of the left eye or the visible region of the right eye. When viewing a 3D image, the sub-pixels for displaying the left-eye image is ⅓ of the total sub-pixels, and similarly, the sub-pixels for displaying the right-eye image is ⅓ of the total sub-pixels, and for a pixel array without buffer pixels, each eye may seen ½ of the total sub-pixels, and the buffer pixels are added in this way, so that a number of sub-pixels for displaying an image seen by each eye is relatively reduced, which may be compensated by pixel rendering.

In addition, it should be noted here that, the pixel array according to the second embodiment may be acquired by rotating the pixel array according to the first embodiment by 90 degrees; for example, for a handheld display device such as a cell phone, the pixel array according to the first embodiment is the pixel array in a normal state, and the pixel array in a landscape mode after rotating by 90 degrees is the pixel array according to the second embodiment.

Of course, the pixel array according to the second embodiment may be not related with the pixel array according to the first embodiment, but may be used as a pixel array in a landscape state, or be used as a pixel array when the display device normally operates, which is not limited by the embodiment of the present disclosure, and can be selected by the skilled in the art according to actual needs.

A Third Embodiment

The embodiment provides a display device, comprising: a display panel, the display panel including the pixel array described above, and including an array substrate and an opposed substrate opposite to each other, the plurality of gate lines and the plurality of data lines being formed on the array substrate.

Here, when the display device is in a 3D display mode, for each row of the sub-pixels of the pixel array comprised in the display device, N sub-pixels are defined as buffer pixels every M sub-pixels of the three different colors, the buffer pixels display a black color, where M and N are nonzero natural numbers, and a set of the M sub-pixels and the N buffer pixels is alternately used as a visible region of a left eye and a visible region of a right eye along the row direction.

Further, the display device further comprises a light-splitting device, configured to project light for displaying a left-eye image and light for displaying a right-eye image to a left eye and a right eye of a viewer in a 3D display mode, respectively.

Exemplarily, the light-splitting device may be arranged on a light incident side or a light exiting side of the display panel.

Further, the display device according to the embodiment may further comprise an eye tracking device, configured to detect positions of eyes of the viewer and determine a position of a sub-pixel column at a far end in sub-pixel columns of the display panel seen by a left eye or a right eye of the viewer in a 3D display mode, and according to the position of the sub-pixel column at the far end, determine the sub-pixel column at the far end and P columns of sub-pixels adjacent thereto as the buffer pixels displaying a black color and determine the M columns of sub-pixels on the left and right sides of the P+1 columns of sub-pixels to display the left-eye image and the right-eye image, respectively, where P+1=N, P is a natural number, and M and N are nonzero natural numbers. For example, the eye tracking device may be a camera and so on.

Exemplarily, when the display device is a display device which can switch between a 2D mode and a 3D mode, the light-splitting device may be an active light-splitting device, for example, may be a controllable liquid crystal lens, a liquid crystal grating or an electrochromic grating, so that the whole light-splitting device may light-transmitting in the 2D display mode, and the liquid crystal lens, the liquid crystal grating and the electrochromic grating play a role of splitting light in the 3D display mode.

When the display device is only used for 3D display, the light-splitting device may be a passive light-splitting device, for example, a split grating including a light-transmitting part and a light-shading part which are fixed.

Further, through the optical path diagram shown in FIG. 13, a formula for calculating a pitch of a grating or a lens of the light-splitting device may be acquired: Ws=KQB(M+N)/(Q+(M+N)B), where K is a number of viewpoints of the display device in a 3D display mode, Q is a distance between a left eye and a right eye of the viewer, and B is a length of each sub-pixel along the row direction, N is a number of the buffer pixels, M is a number of sub-pixels normally displaying an image on the left or right sides of the N buffer pixels, and here, M and N are natural numbers greater than or equal to 1.

For the display device comprising the pixel array according to the first embodiment, since a length of each sub-pixel along a horizontal direction is greater than a length along a vertical direction, as compared with a conventional virtual pixel, a number of channels for the data lines may be reduced. And thus product cost may be significantly reduced; when the display device (e.g., a cell phone) is rotated by 90 degrees to a landscape mode, more sub-pixels may be arranged in a row direction, so that a resolution in the row direction may be improved, content displayed in an image may be increased, and image quality may be further improved.

For the display device comprising the pixel array according to the second embodiment, when it is applied in a 3D display, more sub-pixels may be arranged in the row direction, so that a horizontal resolution in the row direction may be improved, content displayed in an image may be increased, and image quality may be further improved; and further, for a display device comprising a pixel array with buffer pixels, in a 3D display mode, a visible region of a left eye and a visible region of a right eye are added with buffer pixels displaying a black color, so that a left-eye image and a right-eye image are separated from each other, it is possible to alleviate crosstalk between the left-eye image and the right-eye image, and increase a continuous viewing distance of a 3D image.

Moreover, for a display device comprising an eye tracking device, positions of buffer pixels in the pixel array are not fixed, which are determined by viewing positions of eyes, as compared with a display device where the positions of buffer pixels are fixed, crosstalk may be further improved, and a continuous viewing distance of a 3D image may be maximized.

A Fourth Embodiment

The present embodiment provides a display method, for any display device described above; for simplification, a structure of the display device will not be repeated here.

Hereinafter, it is mainly described the display method according to the embodiment of the present disclosure, and the display method comprises:

Step 1: setting the display device to be in a 3D display mode, and receiving and displaying data of a left-eye image and data of a right-eye image in a frame of image;

Step 2: for each row of the sub-pixels, defining N sub-pixels as buffer pixels displaying a black color every M sub-pixels of the three different colors, where M and N are nonzero natural numbers;

Step 3: alternately inputting the data of the left-eye image and the data of the right-eye image into a set of the M sub-pixels and the N buffer pixels to be alternately used as a visible region of the left eye and a visible region of the right eye.

Exemplarily, for a display device comprising an eye tracking device, step 2 of the display method includes:

Detecting a positions of eyes of the viewer by using the eye tracking device;

Determining a position of a sub-pixel column at a far end in sub-pixel columns of the display panel seen by a left eye or a right eye of the viewer;

According to the position of the sub-pixel column at the far end, setting the sub-pixel column at the far end and P columns of sub-pixels adjacent thereto as the buffer pixels displaying a black color and setting the M columns of sub-pixels on the left and right sides of the P+1 columns of sub-pixels to display the left-eye image and the right-eye image, respectively, where P+1=N, P is a natural number.

Further, before the step 2 and after the step 3, the display method further comprises:

Rendering sub-pixels, so that original image data corresponding to the buffer pixel is output from the adjacent sub-pixels for displaying a left-eye image or a right-eye image in the set where the buffer pixel are located, so as to acquire corrected data of the left-eye image and corrected data of the right-eye image; and thus, loss of resolution caused by introducing the buffer pixels may be compensated.

Hereinafter, it is exemplarily described the rendering the sub-pixels in conjunction with FIG. 8 and FIG. 11, a sub-pixel (the sub-pixel is a sub-pixel R when the buffer pixel is not added) on a right side of a top point D of ΔCDE in FIG. 8 is used as a buffer pixel, information compensation may be performed by borrowing the sub-pixel R of a top point E of ΔCDE, and at this moment, the loss of resolution may be compensated. Different from FIG. 8, the buffer pixels arranged in a snake-like shape may cause a buffer pixel in a certain position to cover sub-pixels of two colors; as shown in FIG. 11, the buffer pixel covers the sub-pixels of two colors of B and G, so that a R:G:B in the left-eye image and the right-eye image does not meet 1:1:1, and it can be found that, there are much more red sub-pixels in FIG. 11; and at this moment, normal display may be realized by a method that a red sub-pixel at a top point F of ΔCDF or red sub-pixels at top points E and F in FIG. 11 are turned off for reducing brightness according to a certain proportion. Thereby, the loss of resolution caused by adding the buffer pixels may be compensated.

In the display method according to the present embodiment, in a 3D display mode, a visible region of a left eye and a visible region of a right eye are added with buffer pixels displaying a black color, so that a left-eye image and a right-eye image are separated from each other, it is possible to alleviate crosstalk between the left-eye image and the right-eye image, and increase a continuous viewing distance of a 3D image. Further, by introducing an eye tracking device, a positions of a buffer pixel in the pixel array is not fixed, which are determined by a viewing position of eyes, so that crosstalk may be further alleviated, and a continuous viewing distance of a 3D image may be maximized. In addition, by adding a pixel rendering technology, the loss of resolution caused by adding the buffer pixel may be compensated, so a display effect is further improved.

Here, it should be noted that, since there is shifting between sub-pixels, accordingly, the gate line or the data line for defining each sub-pixel may form a fold line, a row direction or a column direction corresponding to the fold line is a horizontal direction or a vertical direction in general, but is not a vertical direction or a horizontal direction in a strict sense; taking FIG. 2 for example, a connecting line between central lines of a first row of sub-pixels is R1, it can be seen from FIG. 2 that, since the gate line 11 for defining the sub-pixel is a fold line, which is obviously an arrangement direction of the first row of sub-pixels, that is, the row direction follows a shape and extending direction of the gate line, so the row direction is not a horizontal direction in a strict sense, but a direction which is substantially horizontal and allowed to having sight bending.

The above are only specific embodiments of the present application, but the scope of the embodiment of the present disclosure is not limited thereto, and any skilled in the art, within the technical scope disclosed by the embodiment of the disclosure, can easily think of variations or replacements, which should be covered within the protection scope of the embodiment of the present disclosure.

The present application claims priority of Chinese Patent Application No. 201510065382.0 filed on Feb. 6, 2015, the disclosure of which is incorporated herein by reference in its entirety as part of the present application.

The invention claimed is:

1. A pixel array, comprising a plurality of sub-pixels arranged along a row direction and a column direction, the plurality of sub-pixels being defined by a plurality of data lines and a plurality of gate lines intersecting with each other, the data lines extending along the row direction, and the gate lines extending along the column direction, wherein, each row of sub-pixels includes a plurality of repeating units arranged sequentially, each repeating unit including sub-pixels of three different colors;

for each column of the sub-pixels, any two adjacent sub-pixels are of different colors;

an extending direction of the data lines is consistent with the row direction and an extending direction of the gate lines is consistent with the column direction;

each of the sub-pixels has a length L along the extending direction of the data lines and a height H along the extending direction of the gate lines, the length L being less than the height H; and in any two adjacent sub-pixels in each column of the sub-pixels, a lower sub-pixel shifts by a distance D with respect to an upper sub-pixel along the extending direction of the data lines, where $-L<D<0$ or $0<D<L$, wherein, in a 3D display mode, for each row of the sub-pixels, N sub-pixels are defined as buffer pixels every M sub-pixels of the three different colors, the buffer pixels display a black color, where M and N are natural numbers greater than or equal to 1, and a set of the M sub-pixels and the N buffer pixels is alternately used as a visible region of a left eye and a visible region of a right eye along the row direction, wherein any adjacent buffer pixels in a same column for different rows of the sub-pixels are shifted by the distance D with respect to each other, the buffer pixels in a same column are not located in a same straight line along the column direction.

2. The pixel array according to claim 1, wherein, in any two adjacent sub-pixels in each column of the sub-pixels, the lower sub-pixel shifts by the distance D rightwards with respect to the upper sub-pixel along the row direction, and $0<D<L$.

3. The pixel array according to claim 1, wherein, in each column of the sub-pixels, there is no relative shifting between sub-pixels in an odd-numbered row, there is no relative shifting between sub-pixels in an even-numbered row, and in any two adjacent sub-pixels, the sub-pixel in an even-numbered row shifts by the distance D rightwards along the row direction with respect to a previous row sub-pixel adjacent thereto, and $0<D<L$.

4. The pixel array according to claim 3, wherein, in any two adjacent sub-pixels, the sub-pixel in an odd-numbered row shifts by the distance D leftwards along the row direction with respect to a previous row sub-pixel adjacent thereto, and −L<D<0.

5. The pixel array according to claim 1, wherein the length L and the height H meet relationships of:

$$L = H; L = \frac{2H}{3}; \text{ or } L = \frac{H}{2}.$$

6. The pixel array according to claim 4, wherein, for each column of the sub-pixels, sub-pixels in an odd-numbered row are of a same color, and sub-pixels in an even-numbered row are of a same color.

7. A display device, comprising:
a display panel, including the pixel array according to claim 1, and including an array substrate and an opposed substrate opposite to each other, the plurality of gate lines and the plurality of data lines being formed on the array substrate,
wherein the display device further comprises:
an eye tracking device, configured to detect positions of eyes of a viewer and determine a position of a sub-pixel column at a far end in sub-pixel columns of the display panel seen by a left eye or a right eye of the viewer in the 3D display mode, and according to the position of the sub-pixel column at the far end, determine the sub-pixel column at the far end and P columns of the sub-pixels adjacent to the sub-pixel column at the far end as the buffer pixels displaying the black color and determine the M columns of sub-pixels on a left side and a right side of the P+1 columns of sub-pixels to display a left-eye image and a right-eye image, respectively, where P+1=N, P is a natural number, and M and N are nonzero natural numbers.

8. The display device according to claim 7, further comprising:
a light-splitting device, configured to project light for displaying a left-eye image and light for displaying a right-eye image to a left eye and a right eye of the viewer in the 3D display mode, respectively.

9. The display device according to claim 8, wherein the light-splitting device is a liquid crystal lens, a liquid crystal grating or an electrochromic grating.

10. The display device according to claim 9, wherein, a lens pitch of the liquid crystal lens or a grating pitch of the liquid crystal grating is Ws, Ws=KQB (M+N)/(Q+(M+N) B), where K is a number of viewpoints of the display device in the 3D display mode, Q is a distance between a left eye and a right eye of the viewer, and B is a length of each of the sub-pixels along the row direction.

11. A display method for a display device, the display device comprising:
a display panel, including the pixel array according to claim 1, and including an array substrate and an opposed substrate opposite to each other, the plurality of gate lines and the plurality of data lines being formed on the array substrate;
a light-splitting device, configured to project light for displaying a left-eye image and light for displaying a right-eye image to a left eye and a right eye of a viewer, respectively; and
an eye tracking device, configured to detect positions of eyes of the viewer and determine a position of a sub-pixel column at a far end in sub-pixel columns of the display panel seen by the left eye or the right eye of the viewer,
the display method comprising:
step 1: setting the display device to be in the 3D display mode, and receiving and displaying data of the left-eye image and data of the right-eye image in a frame of image;
step 2: for each row of the sub-pixels, defining N sub-pixels as buffer pixels displaying the black color every M sub-pixels of the three different colors, where M and N are nonzero natural numbers; and
step 3: alternately inputting the data of the left-eye image and the data of the right-eye image into a set of the M sub-pixels and the N buffer pixels to be alternately used as a visible region of the left eye and a visible region of the right eye,
wherein the step 2 includes:
detecting the positions of eyes of the viewer by using the eye tracking device,
determining a position of a sub-pixel column at a far end in sub-pixel columns of the display panel seen by a left eye or a right eye of the viewer, and
according to the position of the sub-pixel column at the far end, setting the sub-pixel column at the far end and P columns of sub-pixels adjacent to the sub-pixel column at the far end as the buffer pixels displaying the black color and setting the M columns of sub-pixels on a left side and a right side of the P+1 columns of sub-pixels as sub-pixels for displaying the left-eye image and sub-pixels for displaying the right-eye image, respectively, where P+1=N, and P is a natural number.

12. The display method for the display device according to claim 11, before the step 2 and after the step 3, further comprising:
rendering sub-pixels, so that original image data corresponding to the buffer pixel is output from a nearest sub-pixel having a same color as the buffer pixel, so as to acquire corrected data of the left-eye image and corrected data of the right-eye image.

13. A pixel array, comprising a plurality of sub-pixels arranged along a row direction and a column direction, the plurality of sub-pixels being defined by a plurality of data lines and a plurality of gate lines intersecting with each other, the gate lines extending along the row direction, and the data lines extending along the column direction, wherein,
each column of sub-pixels include a plurality of repeating units arranged sequentially, each repeating unit including sub-pixels of three different colors;
for each row of the sub-pixels, any two adjacent sub-pixels are of different colors;
an extending direction of the gate lines is consistent with the row direction, and an extending direction of the data lines is consistent with the column direction;
each of the sub-pixels has a length L1 along the extending direction of the gate lines and a height H1 along the extending direction of the data lines, the length L1 being greater than the height H1; and
in any two adjacent sub-pixels in each row of the sub-pixels, a right sub-pixel shifts by a distance D with respect to a left sub-pixel along the extending direction of the data lines, where −H1<D<0 and 0<D<H1,
wherein, in a 3D display mode, for each column of the sub-pixels, N sub-pixels are defined as buffer pixels every M sub-pixels of the three different colors, the buffer pixels display a black color, where M and N are natural numbers greater than or equal to 1, and a set of the M sub-pixels and the N buffer pixels is alternately used as a visible region of a left eye and a visible region of a right eye along the column direction, wherein any adjacent buffer pixels in a same row for different columns of the sub-pixels are shifted by the distance D with respect to each other, the buffer pixels in a same row are not located in a same straight line along the row direction.

14. The pixel array according to claim 13, wherein the length L1 and the height H1 meet relationships of:

$$H1 = L1; H1 = \frac{2L1}{3}; \text{ or } H1 = \frac{L1}{2}.$$

15. The pixel array according to claim 14, wherein the sub-pixels of the three different colors include a red sub-pixel, a green sub-pixel and a blue sub-pixel.

* * * * *